United States Patent
Li et al.

(10) Patent No.: US 6,545,895 B1
(45) Date of Patent: *Apr. 8, 2003

(54) HIGH CAPACITY SDRAM MEMORY MODULE WITH STACKED PRINTED CIRCUIT BOARDS

(75) Inventors: Che-yu Li, Ithaca, NY (US); Sharon L. Moriarty, Mountain View, CA (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/127,036

(22) Filed: Apr. 22, 2002

(51) Int. Cl.[7] .................................................. G11C 5/02
(52) U.S. Cl. .............................. 365/52; 365/51; 365/63
(58) Field of Search ........................... 365/52, 51, 63, 365/56, 148, 145; 257/532

(56) References Cited

U.S. PATENT DOCUMENTS

| | | | |
|---|---|---|---|
| 5,412,538 A | * | 5/1995 | Kikinis et al. .............. 174/260 |
| 5,856,937 A | * | 1/1999 | Chu et al. ..................... 365/51 |
| 5,867,419 A | * | 2/1999 | Chengson et al. ............. 365/63 |
| 6,317,352 B1 | * | 11/2001 | Halbert et al. ................. 365/52 |

* cited by examiner

*Primary Examiner*—David Lam
(74) *Attorney, Agent, or Firm*—Salzman & Levy

(57) ABSTRACT

The present invention is a family of memory modules. In one embodiment a memory module with granularity, upgradability, and a capacity of two gigabytes uses 256 MB SDRAM or DDR SDRAM memory devices in CSPs in a volume of just 4.54 inches by 2.83 inches by 0.39 inch. Each module includes an impedance-controlled substrate having contact pads, memory devices, and other components, including optional driver line terminators, on its surfaces. The inclusion of spaced, multiple area array interconnections allows memory devices to be symmetrically mounted on each side of each of the area array interconnections, thereby reducing the interconnect lengths and facilitating the matching of interconnect lengths. Short area array interconnections, including BGA, PGA, and LGA options or interchangeable alternative connectors provide interconnections between the modules and the rest of the system. Thermal control structures may be included to maintain the memory devices within a reliable range of operating temperatures.

73 Claims, 7 Drawing Sheets

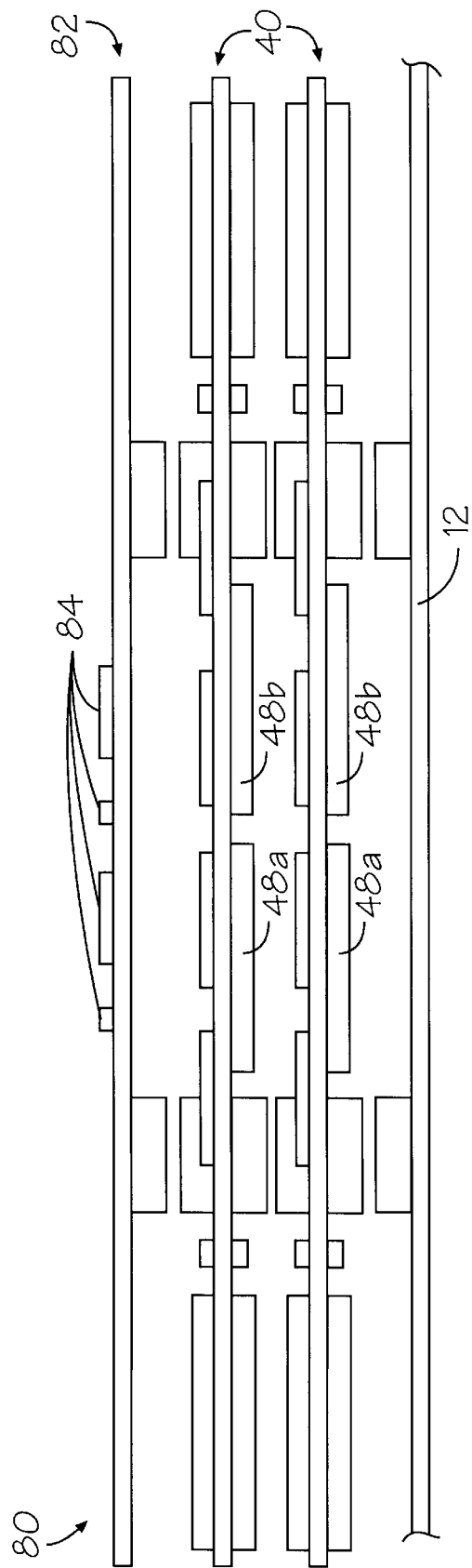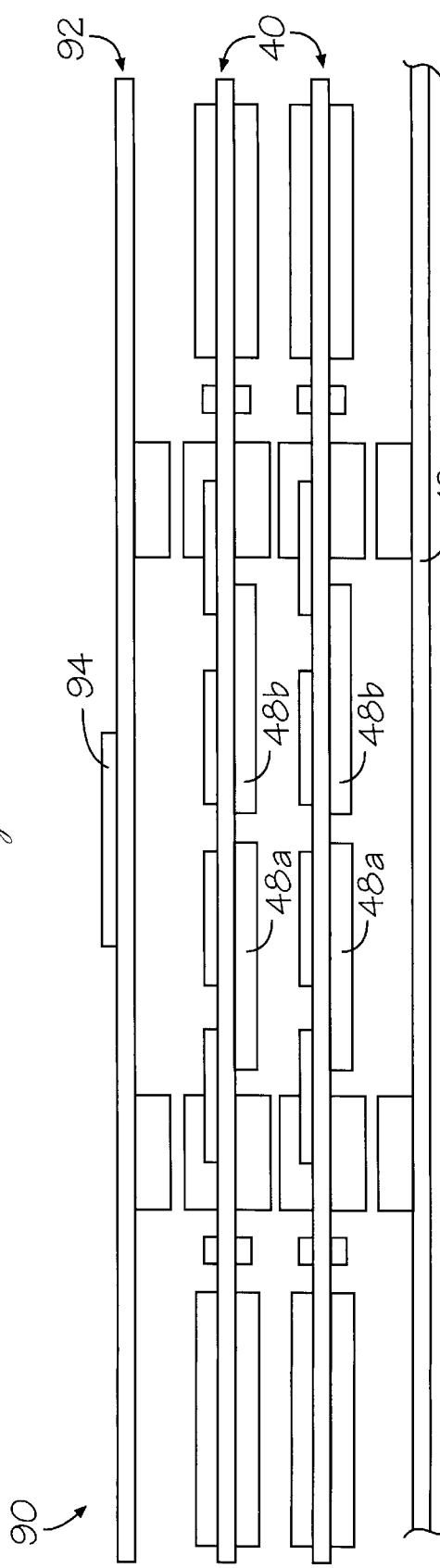

HIGH CAPACITY SDRAM MEMORY MODULE WITH STACKED PRINTED CIRCUIT BOARDS

RELATED PATENT APPLICATIONS

This application is related to copending U.S. patent applications Ser. Nos. 09/932,525 filed Aug. 17, 2001; 09/932,654 filed Aug. 17, 2001; and 10/077,057 filed Feb. 19, 2002, all of which are hereby incorporated by reference.

FIELD OF THE INVENTION

The present invention relates to high input/output (I/O), high density, low cost electronic modules and, more particularly, to the high I/O, high density, low cost packaging of high performance, high density memory devices such as Double Data Rate (DDR) Synchronous Dynamic Random Access Memory (SDRAM) and having impedance-controlled buses for maintaining high electrical performance.

BACKGROUND OF THE INVENTION

In data processing and network systems, it can always be certain that the demand in memory capacity will increase at a high rate. Such increase has in recent years taken on a new dimension; while memory demand increased, the space available for mounted memory devices has become increasingly restricted. The Electronic Industries Alliance (EIA) has set up a standard for the dimensions for rack-mountable equipment. Traditionally, a piece of rack-mountable equipment has a standard width of 19 inches and a height in increments of 1.75 inches. This is also known as "1U." However, a trend has begun to reduce the height for the servers in a server rack to dimensions appreciably lower than 1U.

This equipment height restriction has also placed height restrictions on other components such as memory modules. The traditional SDRAM dual inline memory modules (DIMMs) are simply too tall to be able to be mounted vertically on the system board. Special sockets have been designed to allow DIMMs to be mounted either at an angle or even parallel to the system board. As the speed of memory devices increases to greater than 200 megahertz, for example, the electrical performance of such DIMM sockets is becoming inadequate.

One method being used today to solve the need to increase both memory capacity and density is to stack two, thin small outline package (TSOP) SDRAM devices on top of each other on a DIMM. An alternate approach is to stack two devices within a chip scale package (CSP). These stacking schemes, while increasing memory density, are not easily reworkable.

It is desirable to find a packaging solution that resolves both the capacity and the height issues. In addition, the solution must also be low in cost, readily manufacturable, upgradable with ample granularity, have improved electrical performance even at high frequencies, and have good reliability. Ample granularity allows the amount of memory on a given memory module to be increased or decreased in smaller increments (e.g., in increments of 256 megabytes, instead of one gigabyte).

It is therefore an object of the invention to provide a high capacity, high density, low profile SDRAM memory module for high performance memory devices.

It is another object of the invention to provide a high capacity, high density, low profile SDRAM memory module that is readily manufacturable and upgradable.

It is still another object of the invention to provide a high capacity, high density, low profile SDRAM memory module that provides improved electrical performance at high frequencies and good reliability.

SUMMARY OF THE INVENTION

The present invention is a family of specialized embodiments of the modules taught in the referenced copending U.S. patent applications. A memory module is desired with granularity, upgradability, and a capacity of two gigabytes using 256 MB SDRAM or DDR SDRAM memory devices in CSPs in a volume of just 4.54 inches by 2.83 inches by 0.39 inch.

Each module includes a substrate, having contact pads and memory devices on its surfaces, and impedance-controlled transmission line signal paths to support high speed operation. The substrates may be conventional printed circuit cards preferably with CSP packaged memory devices along with other components attached directly to both sides of the substrates.

The inclusion of spaced, multiple area array interconnections allows a row of memory devices to be symmetrically mounted on each side of each of the area array interconnections, thereby reducing the interconnect lengths and facilitating matching of interconnect lengths. The footprints for the interconnections between the substrates and to the system board are the same to reduce part number and reliability and qualification testing. Short area array interconnections, including ball grid array (BGA), pin grid array (PGA), and land grid array (LGA) options, or interchangeable alternative connectors, provide interconnections between modules and the rest of the system. The distance between the spaced multiple area array interconnections is preferably chosen to ensure that the solder joints in the BGA interconnection option are reliable.

Driver line terminators may be included on the substrates for maintaining high electrical performance. Thermal control structures may also be included to maintain the memory devices within a reliable range of operating temperatures.

BRIEF DESCRIPTION OF THE DRAWINGS

A complete understanding of the present invention may be obtained by reference to the accompanying drawings when taken in conjunction with the detailed description thereof and in which:

FIG. 1b is an enlarged, side elevational view of a vertical plated-through-hole attach connector and memory card of the prior art interconnection shown in FIG. 1a;

FIG. 3b is a cross sectional view of a multi-card configuration based on the memory module of FIG. 3a;

FIG. 4a is a cross sectional view of the multi-card configuration of FIG. 3b including a termination module;

FIG. 4b is a cross sectional view of the multi-card configuration of FIG. 3b including an additional module with other functionality.

DETAILED DESCRIPTION OF THE PREFERRED EMBODIMENT

Generally speaking, the present invention is a family of specialized embodiments that represents improvements of the modules taught in the referenced copending U.S. patent applications. The memory module has granularity, upgradability, and a capacity of two gigabytes using 256 MB SDRAM or DDR SDRAM memory devices in CSPs in a volume of just 4.54 inches by 2.83 inches by 0.39 inch.

Each module includes a substrate, having contact pads and memory devices on its surfaces, and impedance-controlled transmission line signal paths to support high speed operation. The substrates may be conventional printed circuit cards preferably with CSP packaged memory devices along with other components attached directly to both sides of the substrates.

The inclusion of spaced, multiple area array interconnections allows a row of memory devices to be symmetrically mounted on each side of each of the area array interconnections, thereby reducing the interconnect lengths and facilitating matching of interconnect lengths. The footprints for the interconnections between the substrates and to the system board are the same to reduce part number and reliability and qualification testing. Short area array interconnections, including ball grid array (BGA), pin grid array (PGA), and land grid array (LGA) options, or interchangeable alternative connectors, provide interconnections between modules and the rest of the system. The distance between the spaced multiple area array interconnections is preferably chosen to ensure that the solder joints in the BGA interconnection option are reliable.

Figure 1A:
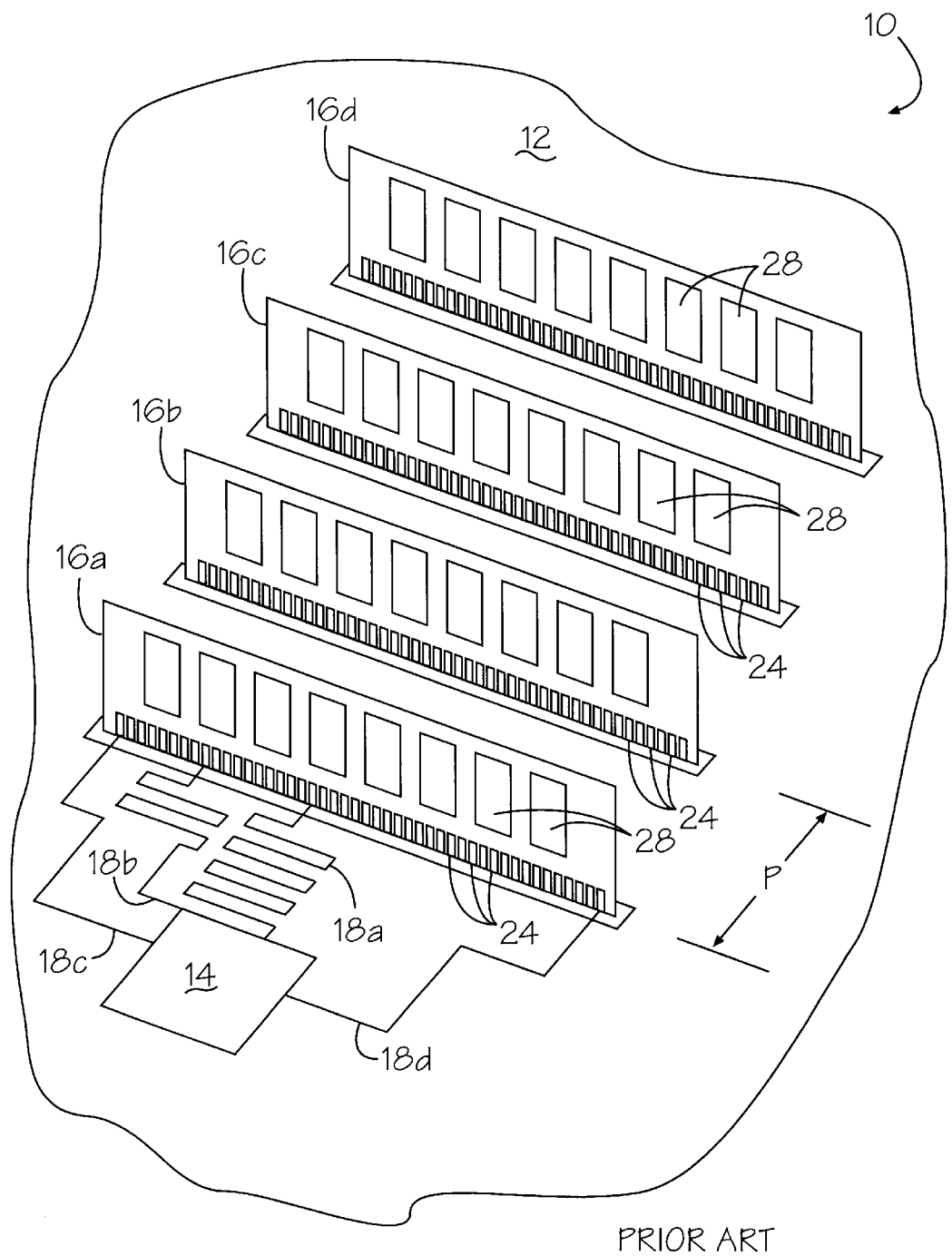
FIG. 1a is a representation of the bussed interconnection between a memory controller device and a multi-card memory arrangement of a memory subsystem of the prior art.

Referring first to FIG. 1a, there is shown a representation of a portion of a memory subsystem 10 of the prior art located on a system board 12, including a memory controller 14 and a multi-card memory arrangement with bussed interconnection therebetween. In this embodiment, memory subsystem 10 is based on DDR SDRAM technology, although many other technologies would also be applicable. Memory controller 14 is electrically connected to memory modules 16a–16d, each comprising a plurality of memory devices 28, through a plurality of bussed interconnections 18a–18d. In order to provide even higher density, memory devices 28 may be located on both sides (FIG. 1b) of memory modules 16a–16d and even stacked upon each other on either one or both sides. This type of stacking is costly, however, unreliable, and difficult to rework. Also, it is very difficult to cool such stacked devices.

Figure 1B:
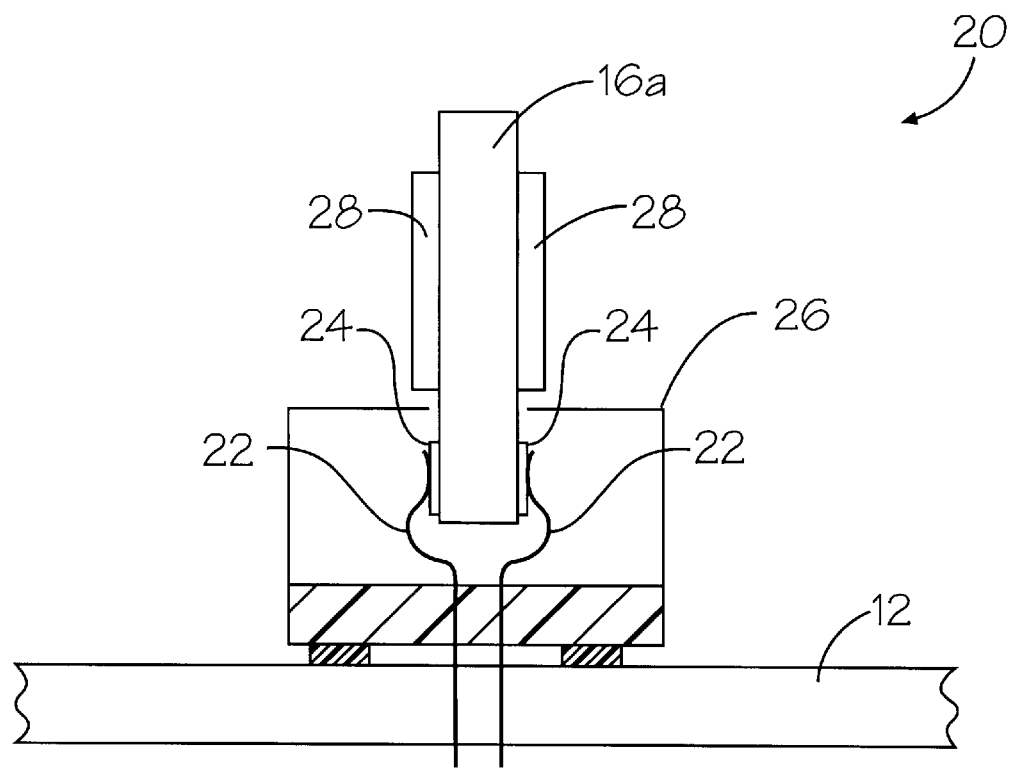

Memory controller 14 connects to system board 12 through an array of BGA solder interconnections (not shown) located on the bottom surface of memory controller 14. Memory modules 16a–16d are approximately 5.25 inches long and 1.38 inches tall, with the top edge about 1.50 inches above the surface of the system board 12, and with a distance between them, "P," of 0.5 inch. Modules 16a–16d include an array of contact pads 24 along their lower edge. Contact pads 24 provide electrical connection to system board 12 through an edge connector, which is not shown for purposes of clarity. A more detailed cross sectional view of a single connector 20 comprising mating contacts 22 and housing 26, and corresponding memory module 16a is shown in FIG. 1b.

Memory modules 16a–16d typically are printed circuit structures comprising epoxy-glass-based materials (i.e., FR4) and including one or more conductive (i.e., signal, power and/or ground) layers therein. Due to stringent electrical specifications, the impedance of the signal traces must match the impedance of the corresponding traces on system board 12 within ten percent.

Assuming that each memory module 16a–16d has 512 megabytes of memory (a quantity that is available today), the volumetric area required for the four modules 16a–16d is 5.25 inches by 1.80 inches by 1.50 inches, or about 13.90 cubic inches, and about 9.45 square inches of area on system board 12. Also, while the height of memory modules 16a–16d just fit in a 1U high enclosure, it is unlikely that these memory modules 16a–16d will fit vertically in sub-1U high enclosures.

Figure 2:
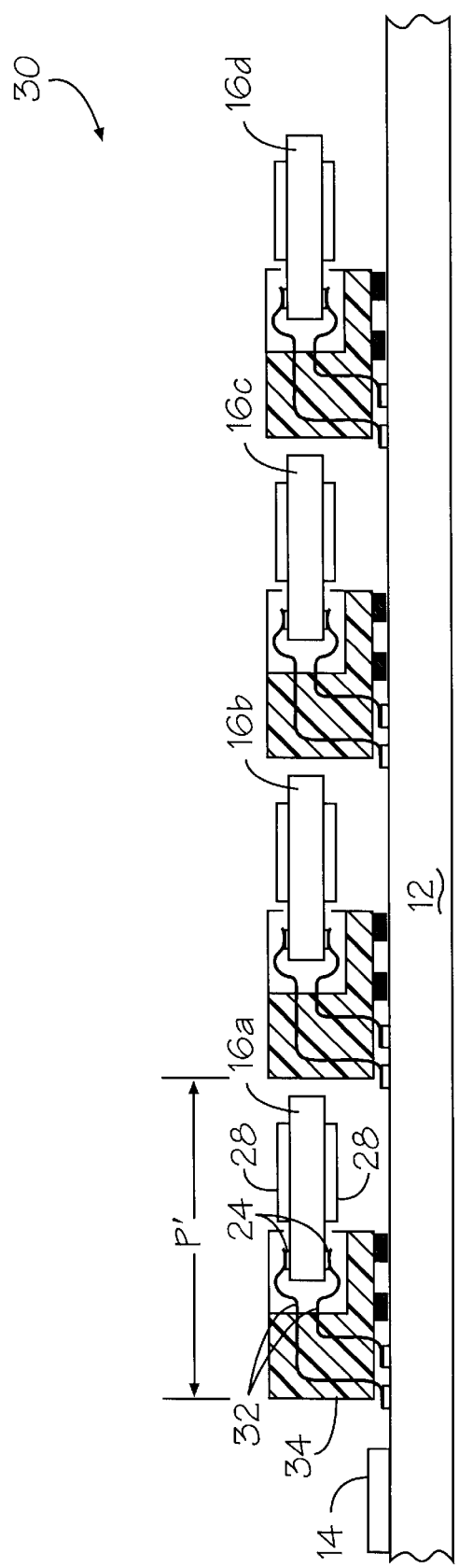
FIG. 2 is a side elevational view of a connector and memory card of the prior art.

Referring now to FIG. 2, there is shown a side elevational view of a portion of a memory subsystem 30, displaying another embodiment of the prior art, located on a system board 12, including a memory controller 14 and a low profile, multi-card memory arrangement. In this embodiment, memory subsystem 30 is based on DDR SDRAM technology, although many other technologies would also be applicable. Again, memory controller 14 is electrically connected to memory modules 16a–16d, each comprising a plurality of memory devices 28, through a plurality of bussed interconnections 18a–18d. Again, in order to provide even higher density, memory devices 28 may be located on both sides of memory modules 16a–16d and even stacked upon each other on either one or both sides. This type of stacking is costly, as aforementioned, unreliable, and difficult to rework. Also, it is very difficult to cool such stacked devices.

Memory controller 14 connects to system board 12 through an array of BGA solder interconnections (not shown) located on the bottom surface of memory controller 14. Memory modules 16a–16d are still about 5.25 inches long, 1.38 inches wide, 0.35 inch tall, and a distance between them, "P'," of 1.70 inch. Modules 16a–16d include an array of contact pads 24 along their lower edge. Contact pads 24 provide electrical connection to system board 12 through connectors 32. Each connector 32 further comprises mating contacts 32 and a housing 34, and corresponding memory modules 16a–16d.

Assuming again that each memory module 16a–16d has 512 megabytes of memory, the volumetric area required for the four modules 16a–16d is 5.25 inches by 6.80 inches by 0.35 inches high, or about 12.50 cubic inches, and about 35.70 square inches of area on system board 12. Compared to the embodiment shown in FIGS. 1a and 1b, the cubic volume used is slightly reduced, but the amount of system board area used increases by over 350 percent, an increase unacceptable in many system designs.

Figure 3A:
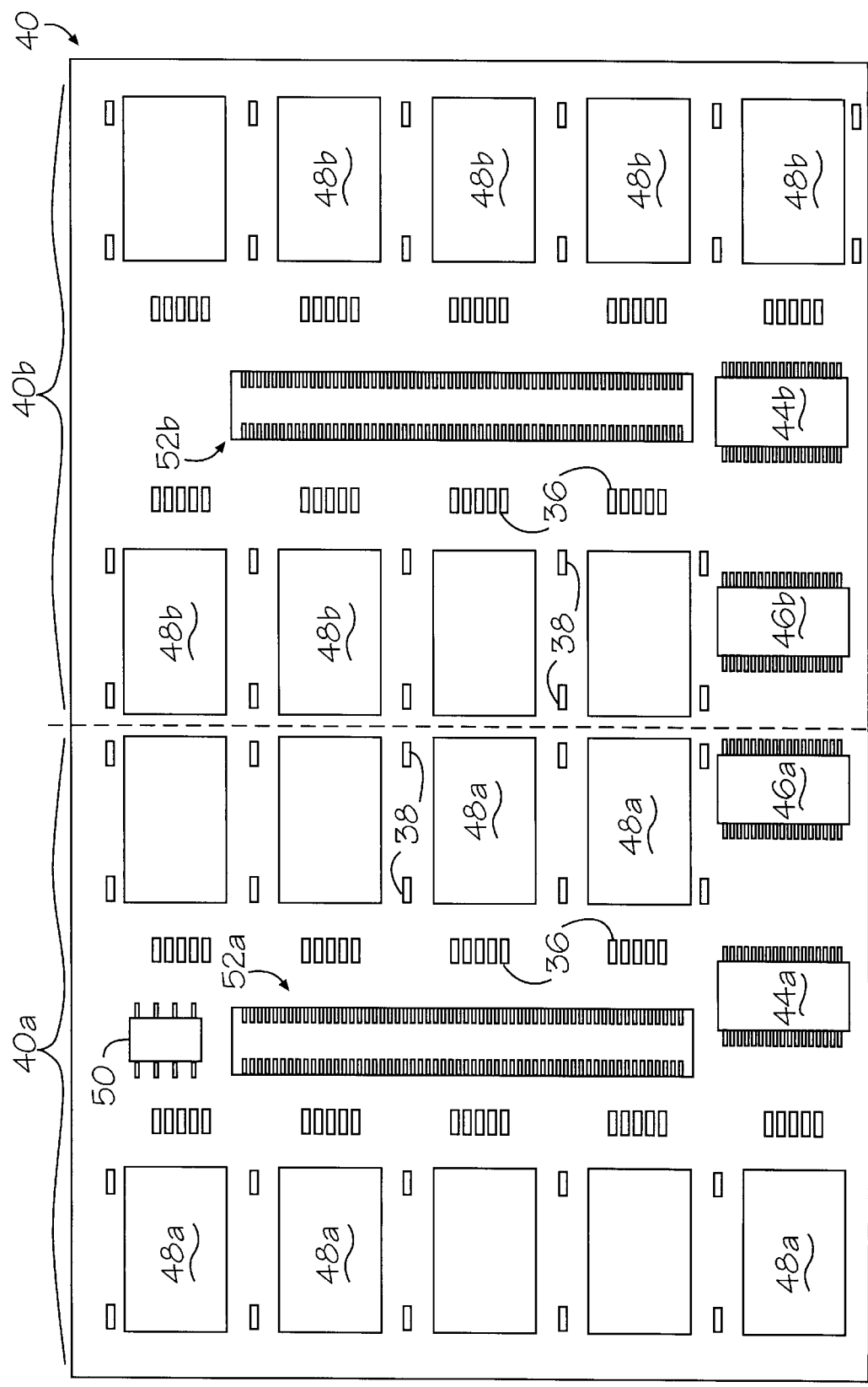
FIG. 3a is a top view of a memory module in accordance with one embodiment of the present invention.
Figure 3B:
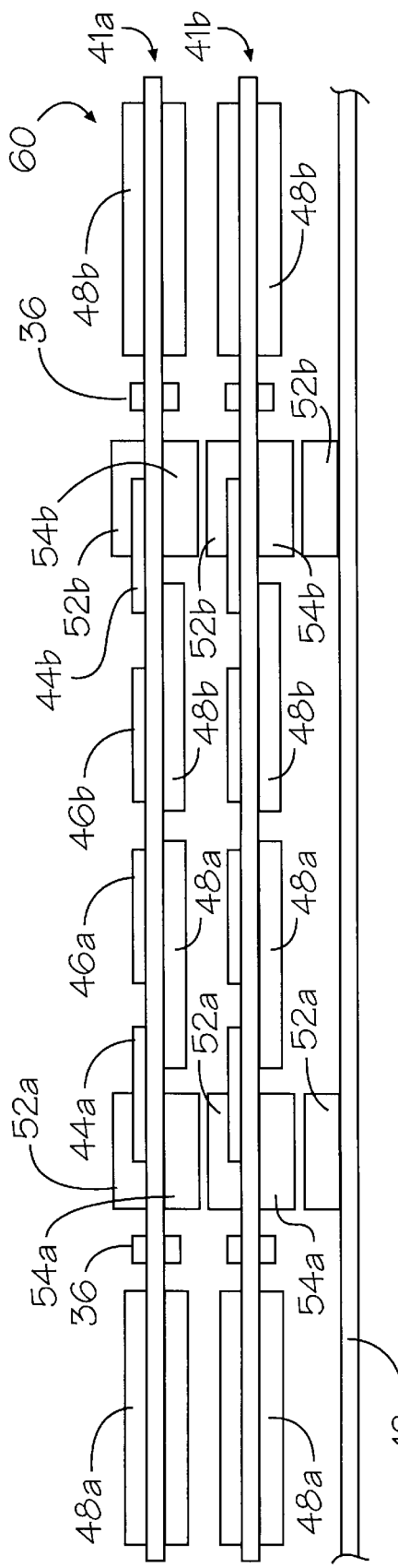

Referring now to FIGS. 3a and 3b, there are shown a top view of a memory module 40 in accordance with one embodiment of the present invention, and a cross sectional view of a multi-card configuration 60 based on the memory module 40 of FIG. 3a, respectively.

In the embodiment of FIG. 3a, memory module 40 includes a substrate 42, a plurality of memory devices 48a and 48b, phase lock loops (PLLs) 44a and 44b, registers 46a and 46b, a configuration memory device 50, resistors 36, capacitors 38, and upper interconnection arrays 52a and 52b. Lower interconnection arrays 54a and 54b and, optionally, additional memory devices 48a and 48b are located on the opposite side (FIG. 3b) of substrate 42.

In this embodiment, memory devices 48a and 48b are 256 MB SDRAM or DDR SDRAM memory devices in CSPs, although other packages, such as bare chip, thin, small-outline packages (TSOP), and chip on board (COB) may be used. The preferred use of packaged devices 48a and 48b eliminates the issues associated with known good die (KGD). Although 256 MB devices are the largest devices available today, it should be understood that memory device capacity is certain to increase in the future, and the use of higher as well as lower capacity memory devices is well within the scope of this invention.

Examples of substrate 42 suitable for interconnection include printed circuit boards, circuit modules, etc. The term "printed circuit board" is meant to include but not be limited to a multilayered circuit structure including one or more conductive (i.e., signal, power and/or ground) layers therein. Such printed circuit boards, also known as printed wiring boards, are well known in the art and further description is not believed necessary. The term "circuit module" is meant to include a substrate or like member having various electrical components (e.g., semiconductor chips, conductive circuitry, etc.), which may form part thereof. Such modules are also well known in the art and further description is not believed necessary.

Substrate 42 may comprise a wide variety of dielectric materials. In one example it is made of epoxy-glass-based materials typically used in printed circuit board fabrication (e.g., FR4) and also includes one or more conductive layers therein. Due to stringent electrical specifications, the signal traces typically match the system impedance within a certain tolerance (e.g., ten percent). These materials are preferred because their CTE substantially matches the CTE of the surrounding structures, especially for applications including land grid array (LGA) connectors, and because of their relatively low cost. Other possible materials include polyimide and RO2800 (a trademark of Rogers Corporation). It should be understood by those skilled in the art that other materials may also be used without departing from the spirit of the invention.

PLLs 44a and 44b are used to control and synchronize the timing against a known system clock for memory devices 48a and 48b. Registers 46a and 46b are used to buffer and latch the state of the address and control buses against a known system clock. Configuration memory device 50 is used to store configuration information about the module 40 for use by the system. In this embodiment device 50 is an electrically erasable programmable read-only memory (EEPROM) device. Resistors 36 may be placed in series in the various electrical nets to dampen reflections. Capacitors 38 are strategically located, especially near memory devices 48a and 48b, and function as decoupling capacitors. Both resistors 36 and capacitors 38 are implemented as surface mount devices in this embodiment but may be implemented in other form factors such as embedded components.

A significant contribution to the advantages of the present invention is derived from the locations of the footprint of upper interconnection arrays 52a and 52b and mating lower interconnection arrays 54a and 54b (FIG. 3b), which may be implemented in many ways. These short area array interconnections may use BGA, PGA, or LGA options, or interchangeable alternative connectors as better shown in FIG. 3b. The specific choice of connectors for interconnection arrays 52a–52b and mating 54a–54b is design dependent and may vary depending on a specific set of requirements. Fox example, the PGA and LGA options are demountable and are therefore useful for applications requiring field upgradability. The LGA option may require an alignment and clamping mechanism. Implementations of these items are covered in one of the referenced copending U.S. patent applications.

The separated interconnection arrays 52a and 52b on the top surface and 54a and 54b on the bottom surface allow a row of memory devices 48a and 48b to be symmetrically mounted on each side of each respective interconnection cluster, which provides the shortest possible electrical path from the memory devices 48a and 48b to system board 12 (FIG. 3b) and facilitates the matching of interconnect length. From a mechanical point of view, the distance between the interconnection arrays 52a–52b and 54a–54b is chosen to be wide enough to support the required quantity of memory devices 48a and 48b, but narrow enough to ensure that the solder joints in the BGA interconnection option are reliable.

Component positioning on memory module 40 provides another benefit over the prior art. Components are positioned on memory module 40 to allow the module 40 to support multiple (two, in this case) channels 40a and 40b of memory. This capability allows a single memory module 40, with memory devices 48a and 48b on both sides (assuming memory devices 48a and 48b each have a capacity of 256 MB) to support up to 1 GB of memory (512 MB per channel), with a granularity of 256 MB per channel.

Depending on how interconnection arrays 54a–54b are wired on the system board 12 (FIG. 3b), the memory devices 48a and 48b may be configured to operate in either a single channel or as multiple independent channels. In one example, this option allows the operation of two 64-bit memory channels (40a and 40b) or a single 128-bit memory channel. A 128-bit memory channel has twice the throughput of a 64-bit channel when operated at the same frequency. A higher throughput is important in many industries required to run real-time applications (e.g., gaming, video graphics, speech processing, and networking applications). Increasing throughput through widening the bus is often much easier to implement and less expensive compared to methods such as doubling the clock frequency of the memory subsystem, reducing latency in bus cycles, implementing complex multi-symbol modulation schemes or pulse code modulation (PCM) type approaches.

For applications requiring less memory, a single channel 40a or 40b can be populated and therefore implemented. For this type of application, since only a single interconnection array pair 52a–54a or 52b–54b is needed but mechanical stability of the overall memory module 40 is desired, to reduce costs the other interconnection array location may be populated by a spacer of similar dimensions as the interconnection array pair. For applications requiring finer granularity, half of the full quantity of memory devices 48a or 48b on a given channel 40a and/or 40b can be populated to reduce the granularity to 256 MB.

Figure 3C:
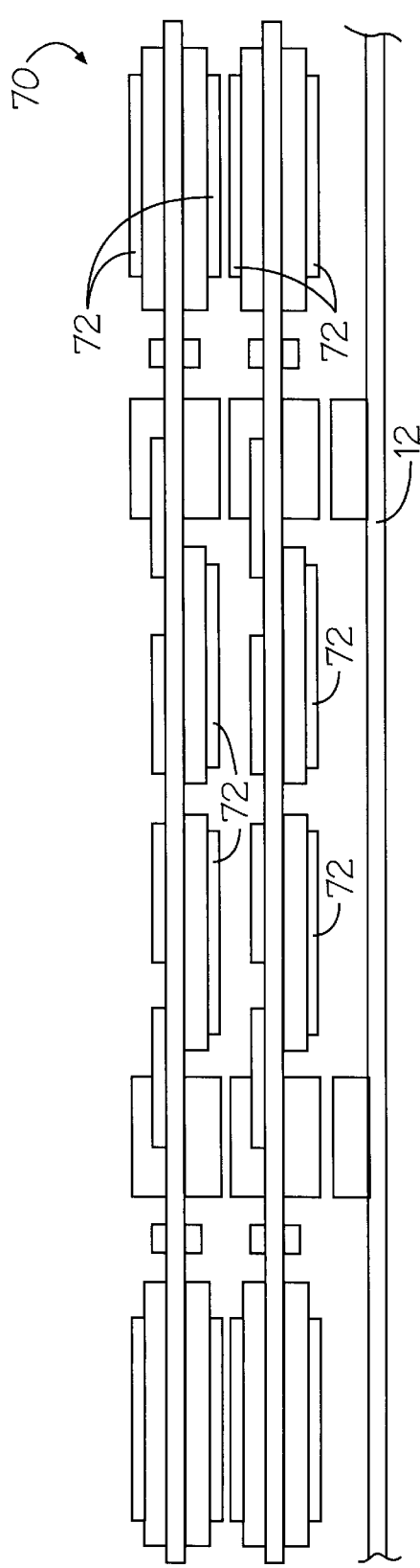
FIG. 3c is a cross sectional view of the multi-card configuration in accordance with an extension of the embodiment of FIG. 3b.

System electrical performance can be further enhanced by including additional functionality, such as termination components to the module 40, without significantly increasing the cost and size of the module 40. This is taught in one of the referenced copending U.S. patent applications. Also, heatspreaders or equivalent thermal conduction devices may be placed in contact with memory devices 48a and 48b to provide improved thermal management if required. This is shown in FIG. 3c.

Another example of additional functionality is the inclusion of decoders (not shown) that may be used to perform functions such as generating extra chip selects for referencing additional memory channels on module 40.

A third example of additional functionality is the inclusion of field programmable components (not shown), which may be used to perform functions such as changing the values of the termination components. The field programmable components may include a field programmable gate array (FPGA), whose outputs control solid state switches to switch in resistive, capacitive, or inductive blocks to establish a termination scheme that provides optimized performance. Some connections on the FPGA may be dedicated to a standard PC bus interface such as I2C, to make the terminations soft programmable.

A field programmable component may alternatively be employed to switch the module operation type from DDR to SDR, for example. Field programmable switches may also be used to deactivate the inverting net of all differential clocks that are not used in SDR operation, as well as to switch in extra components as needed. Other components that may be added include clock synthesizers, skew control blocks, FIFOs, and thermal shutdown or thermal monitoring integrated circuits, which may be installed at strategic hot points on module 40. A thermal shutdown device may be used to disable a power supply until conditions improve. This improves the reliability of memory devices 48a and 48b on module 40.

Compared to the prior art memory modules 16a–16d of memory subsystem 10 (FIG. 1a), the inventive memory modules 40 offer improved signal integrity, due to the fact that the modules 40 have a reduced stub effect. Each electrical net in the prior art memory modules 16a–16d has a stub length up to 1.5 inches long. A stub is any net connecting parallel to the net or controlled transmission line of interest. It may include components. Unterminated stubs often are the result of used connectivity pathways for one or more components that are not populated in a given assembly, and can result in composite reflections that are twice the level of the initial signal. A stub degrades performance due to factors such as the timing relationships of the reflections exiting the stub, how that compares with the propagation delays to the other components on the bus, and the length of duration of the bus cycle. In short the design performance degradation associated with stubs tends to worsen with increasing frequency, longer stub lengths, more stubs, and greater spacing between stubs.

It should be understood by those skilled in the art that the various components of the invention may consist of alternate materials, instead of or in addition to the particular ones described in the disclosed embodiments, without departing from the spirit of the invention.

Referring now again to FIG. 3b, there is shown a cross sectional view of a multi-card configuration 60 based on the memory module 40 of FIG. 3a. In one example of this embodiment, multi-card configuration 60, which includes two memory modules 41a and 41b, has a capacity of two gigabytes of memory in a volume of just 4.54 inches by 2.83 inches by 0.39 inch, or about 5.17 cubic inches, and requires only 1.8 inches by 2.5 inches, or 4.5 square inches of area on system board 12. Compared to prior art embodiments, the volumetric requirement of the invention is reduced by over 200 percent. The area of the system board 12 required for multi-card configuration 60 is reduced by 50 percent compared to the prior art embodiment in FIG. 1a (which cannot support sub-1U high enclosures), and almost 800 percent compared to the prior art embodiment in FIG. 2, while allowing even higher memory expansion capability through additional stacking. Also, the additional amount of system board 12 real estate required for printed circuit traces to wire memory controller 14 to memory modules 16a–16d in FIGS. 1a–2 is significantly greater than for wiring memory controller 14 to memory modules 41a and 41b of multi-card configuration 60 in the present invention, for additional system board 12 real estate savings.

Lower interconnection arrays 54a and 54b on the lower module 41a are provided to allow electrical interconnection to a memory controller 14 on system board 12 through a mating connectors 52a and 52b. Upper interconnection arrays 52a and 52b on the lower module 41a mate with lower interconnection arrays 54a and 54b on the upper module 41b to extend the address and control buses from the memory controller 14. Upper interconnection arrays 52a and 52b on the upper module 41b provides for the stacking of additional memory modules 40 (FIG. 3a) in the future. Maintaining uniform footprints for the interconnection between memory modules as well as to system board 12 reduces the proliferation of different memory module 40 (FIG. 3a) part numbers, and minimizes reliability and qualification testing. The substrates 42 are designed so that the modules 41a and 41b are positionally independent within the stack. In other words, the lower module 41a and upper module 41b may be interchanged within multi-card configuration 60 and still function properly.

The positioning of memory devices 48a and 48b on stackable modules 41a and 41b relative to memory controller 14 (FIGS. 1a and 2) provides several improvements compared to the prior art of FIGS. 1a–2. This is taught in one of the referenced copending U.S. patent applications. The improvements include: reduced propagation delays and hence potentially higher operating frequencies; reduced settling times and periods for the ringing cycle established and associated with impedance mismatches between the bus and termination in a given net, which can also reduce intersymbol interference (ISI); potentially less intra-bus skew be variation, leading to better timing margins; and simplified and reduced system board 12 routing. Reducing the spacing between modules 41a and 41b compared to the prior art examples shown hereinabove provides a performance improvement since reflections off stubs will exist longer on the bus if the spacing between stubs is longer.

Conventional memory modules 16a–16d (FIGS. 1a–2) have a length of about 5.25 inches, which may result in lower frequencies for system board 12 resonance, for the resonant modes established along that axis. This in turn can lead to greater bounce of the power planes for signals whose edge frequencies (one divided by the rise or fall time) are close to the system board 12 resonant modes. The inventive modules 40 are relatively square in shape, with shorter X and Y axes, which may shift the frequency of the resonant modes higher than frequencies of interest. Also, by designing slits in the power planes (for instance between banks of memory devices), the resonant frequencies can be moved even higher.

Referring now to FIG. 3c, there is shown a cross sectional view of a multi-card configuration 70 in accordance with an extension of the embodiment of FIG. 3b, further including thermal management structures 72.

The natural cooling efficiency of a module 40 is low due to the lack of an effective thermal transfer medium from the die or package of memory devices 48a and 48b to the air, and the lack of a short air channel in the direction of air flow (i.e., parallel to system board 12). The thermal problem is exacerbated by the relatively large size of today's memory devices 48a and 48b and the proximity to other heat generating devices 48a and 48b in such a dense module 40. The thermal management structures 72 of the inventive modules 40 are designed to optimize both thermal conduction and radiation, thus allowing maximum circuit density without heat build-up, which could degrade memory device 48a and 48b performance and reliability.

Thermal management structures 72 are intended to sink heat away from memory devices 48a and 48b. Such structures 72 may be stand alone elements (e.g., heatsinks) or they may provide a low resistance thermal path to another surface such as the outer enclosure of a device (e.g., a laptop computer), which may include thermally conductive material.

Thermal management structures 72 may be implemented in many ways. Structures 72 may be as simple as a layer of thermally conductive material, such as aluminum, attached or retained to memory devices 48a and 48b by thermally enhanced compounds or clamps. Structures 72 may be more complex and include elements such as fins (not shown) to augment cooling. Other methods may include the use of conformal pouches of liquid thermal transfer material, thin heat pipes, and thermoelectric devices. Even other methods of solving thermal issues will be obvious to those skilled in the art.

System electrical performance can be further enhanced, and significant system board real estate can be saved by including additional functionality through the inclusion of additional stacked modules. The much lower profile of memory modules 40 allows the stacking of these modules with additional functionality even in sub-1U high applications.

Referring now to FIG. 4a, there is shown a cross-sectional view of a multi-card configuration 80 based on the memory module 40 of FIG. 3a. In this embodiment, multi-card configuration 80, which includes two memory modules 40, further includes a termination module 82. Termination module 82 comprises a plurality of components 84, which typically requires a large number of bulk capacitors, ferrite bead inductors, switching regulators, decoupling capacitors and termination components. The termination components may be passive components such as resistors and/or capacitors, but they may also include active filter-type components.

Referring now to FIG. 4b, there is shown a cross-sectional view of a multi-card configuration 90 based on the memory module 40 of FIG. 3a. In this embodiment, multi-card configuration 90, which includes two memory modules 40, further includes an additional module 92. Module 92 comprises a memory controller 94 that may service the memory modules 40 below it. Module 92 may also use interconnection arrays 52a–52b and 54a–54b to establish electrical interconnection to system board 12.

Figure 5:
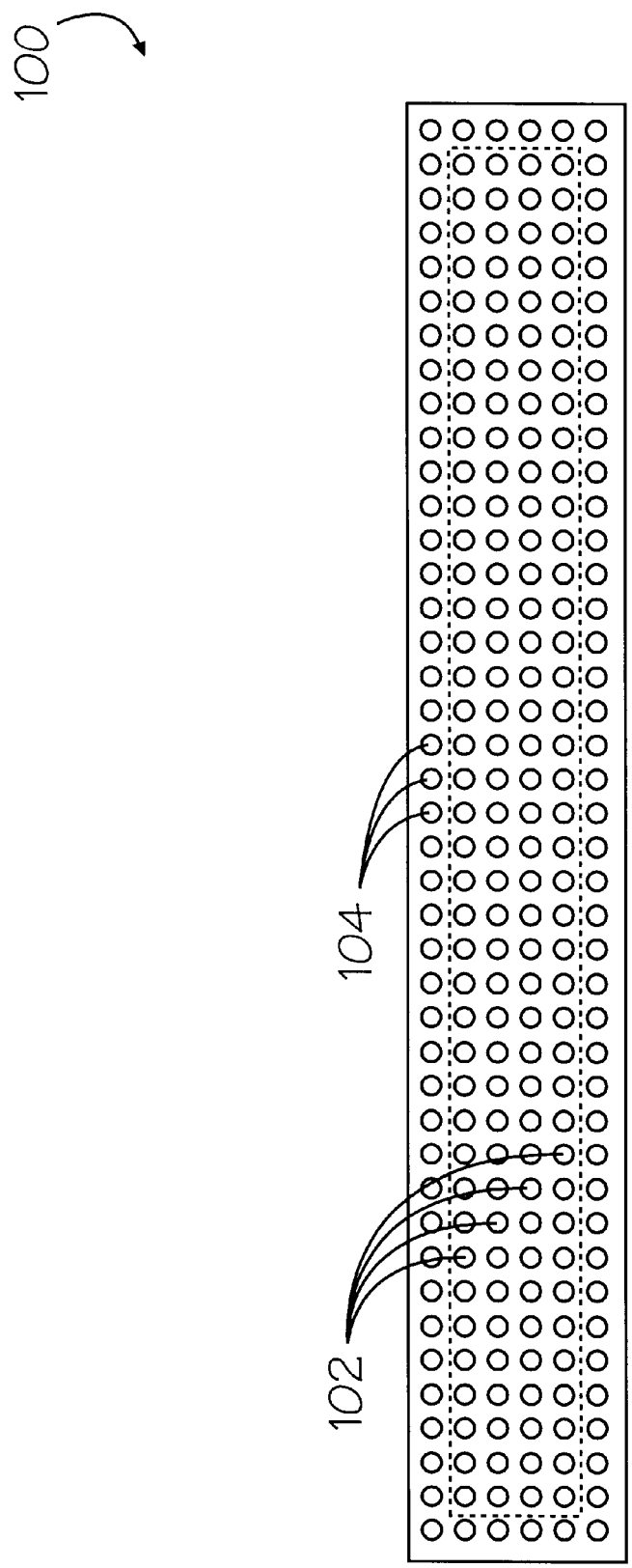
FIG. 5 shows a top view of an array of electrical contacts representative of the electrical connections of the interconnection arrays of the embodiments of the invention.

Referring now to FIG. 5, there is shown an array of electrical contacts 100 representative of the electrical connections that make up upper interconnection arrays 52a and 52b, and lower interconnection arrays 54a and 54b. Array of electrical contacts 100 includes inner contacts 102 and outer contacts 104. For applications in which arrays 52a–52b and 54a–54b are implemented as BGA or LGA interconnections, high frequency electrical radiation may be significantly reduced by assigning the majority of signal connections to inner contacts 102, and assigning primarily ground and reference voltage connections to outer contacts 104, thereby providing a level of shielding. Electromagnetic comparability issues may be further reduced by placing a ground ring (not shown) around each module 40 (FIG. 3a).

Since other modifications and changes varied to fit particular operating requirements and environments will be apparent to those skilled in the art, this invention is not considered limited to the example chosen for purposes of this disclosure and covers all changes and modifications which do not constitute departures from the true spirit and scope of this invention.

Having thus described the invention, what is desired to be protected by Letters Patent is presented in the subsequently appended claims.

What is claimed is:

1. A stackable memory module comprising:
   a) a substrate having a first surface and a second surface and a plurality of contact pads disposed on said first surface thereof, said contact pads being adapted to connect to an external memory bus;
   b) first and second electrical connection means spaced apart on one of said surfaces of said substrate and being operatively connected to said plurality of electrical contacts forming an extension of said external memory bus;
   c) a plurality of memory devices mounted on said substrate and being selectively connected to said memory bus extension; and
   d) a configuration device located on said memory module to store information thereof;
   wherein at least one of said memory devices is located between said first and said second electrical connection means.

2. The stackable memory module as recited in claim 1, wherein said external memory bus comprises a characteristic impedance.

3. The stackable memory module as recited in claim 2, further comprising bus termination means for operative connection to said extension of said external memory bus, said bus termination means having an impedance substantially matching said characteristic impedance.

4. The stackable memory module as recited in claim 3, wherein said bus termination means comprises at least one electrical component from the group: resistors, capacitors and inductors.

5. The stackable memory module as recited in claim 4, wherein said resistors comprise discrete resistors.

6. The stackable memory module as recited in claim 4, wherein said resistors comprise a resistor pack.

7. The stackable memory module as recited in claim 1, further comprising a register device located on one of said substrate surfaces.

8. The stackable memory module as recited in claim 1, further comprising a phase lock loop (PLL) device located on one of said substrate surfaces.

9. The stackable memory module as recited in claim 1, further comprising a plurality of capacitors located on at least one of said substrate surfaces.

10. The stackable memory module as recited in claim 1, further comprising a plurality of resistors located on at least one of said substrate surfaces.

11. The stackable memory module as recited in claim 1, wherein further comprising a register device located on one of said substrate surfaces.

12. The stackable memory module as recited in claim 1, further comprising at least one electrical component located on one of said substrate surfaces, said component being selected from the group of: decoder, field programmable device, clock synthesizer, skew control block, FIFO, thermal shutdown device, and thermal monitoring device.

13. The stackable memory module as recited in claim 1, wherein said first and second electrical connection means comprise land grid array connectors.

14. The stackable memory module as recited in claim 1, wherein said first and second electrical connection means comprise pin grid array connectors.

15. The stackable memory module as recited in claim 1, wherein said first and second electrical connection means comprise ball grid array interconnections.

16. The stackable memory module as recited in claim 1, wherein said first and second electrical connection means comprise portions of pin and socket connectors.

17. The stackable memory module as recited in claim 1, wherein said substrate comprises wiring means connecting at least one of said contact pads on said first surface to at least one of said contact pads on said second surface.

18. The stackable memory module as recited in claim 1, wherein said substrate comprises a multi-layer printed circuit card.

19. The stackable memory module as recited in claim 1, wherein said substrate comprises at least one insulative material.

20. The stackable memory module as recited in claim 19, where in said at least one insulative material is epoxy-glass-based.

21. The stackable memory module as recited in claim 20, wherein said at least one insulative material comprises FR4.

22. The stackable memory module as recited in claim 21, wherein said at least one insulative material comprises polyimide.

23. The stackable memory module as recited in claim 1, wherein at least one of said plurality of memory devices comprises at least one from the group of: bare chip, thin small outline package (TSOP), chip scale package (CSP) and chip on board (COB).

24. The stackable memory module as recited in claim 1, further comprising a thermal management structure.

25. The stackable memory module as recited in claim 24, wherein said thermal management structure comprises heat-conductive fins in thermal contact with at least one of said plurality of memory devices.

26. The stackable memory module as recited in claim 25, further comprising third and fourth electrical connection means operatively connected to said plurality of electrical contacts forming an extension of said external memory bus, and located on said opposite surface of said substrate than said first and second electrical connection means; said third and fourth electrical connection means facilitating interconnection to first and second electrical connection means of a second module.

27. The stackable memory module as recited in claim 26, wherein said second module comprises a second stackable memory module.

28. The stackable memory module as recited in claim 26, wherein said second module comprises a termination module.

29. The stackable memory module as recited in claim 1, wherein said memory devices comprise SDRAM devices.

30. The stackable memory module as recited in claim 1, wherein said memory devices comprise DDR SDRAM devices.

31. The stackable memory module as recited in claim 1, wherein nine of said memory devices are mounted on each of said surfaces of said substrate.

32. The stackable memory module as recited in claim 1, wherein said external memory bus comprises a plurality of channels.

33. The stackable memory module as recited in claim 1, wherein said stackable memory module comprises a plurality of channels.

34. A memory module comprising:
a) a substrate having a first surface and a second surface and a plurality of contact pads disposed on said first surface, said contact pads being adapted to connect to an external memory bus;
b) first electrical connection means having a predetermined height and being operatively connected to said plurality of electrical contacts forming an extension of said external memory bus;
c) a plurality of memory devices mounted on said substrate and being selectively connected to said memory bus extension;
d) a configuration device located on said memory module to store information thereof; and
e) a spacer having a height approximate the same as said predetermined height of said first electrical connection means;
wherein at least one of said memory devices is located between said first electrical connection means and said spacer.

35. The memory module as recited in claim 34, wherein said external memory bus comprises a characteristic impedance.

36. The memory module as recited in claim 35, further comprising bus termination means operatively connected to said extension of said external memory bus, said bus termination means exhibiting an impedance substantially matching said characteristic impedance.

37. The memory module as recited in claim 36, wherein said bus termination means comprises at least one electrical component from the group: resistors, capacitors and inductors.

38. The memory module as recited in claim 37, wherein said resistors comprise discrete resistors.

39. The memory module as recited in claim 37, wherein said resistors comprise a resistor pack.

40. The memory module as recited in claim 34, further comprising a register device located on one of said substrate surfaces.

41. The memory module as recited in claim 34, further comprising a phase lock loop (PLL) device located on one of said substrate surfaces.

42. The memory module as recited in claim 34, further comprising a plurality of capacitors located on at least one of said substrate surfaces.

43. The memory module as recited in claim 34, further comprising a plurality of resistors located on at least one of said substrate surfaces.

44. The memory module as recited in claim 34, wherein further comprising a register device located on one of said substrate surfaces.

45. The memory module as recited in claim 34, wherein said first electrical connection means is a land grid array connector.

46. The memory module as recited in claim 34, wherein said first electrical connection means is a pin grid array connector.

47. The memory module as recited in claim 34, wherein said first electrical connection means is a ball grid array interconnection.

48. The memory module as recited in claim 34, wherein said first electrical connection means comprises a portion of a pin and socket connector.

49. The memory module as recited in claim 34, wherein said substrate comprises wiring means connecting at least one of said contact pads on said first surface to at least one of said contact pads on said second surface.

50. The memory module as recited in claim 34, wherein said substrate comprises a multi-layer printed circuit card.

51. The memory module as recited in claim 34, wherein said substrate comprises at least one insulative material.

52. The memory module as recited in claim 51, wherein said at least one insulative material is epoxy-glass-based.

53. The memory module as recited in claim 52, wherein said at least one insulative material comprises FR4.

54. The memory module as recited in claim 51, wherein said at least one insulative material comprises polyimide.

55. The memory module as recited in claim 34, wherein at least one of said plurality of memory devices comprises at least one from the group of: bare chip, thin, small-outline packages (TSOP), chip scale packages (CSP) and chip on board (COB).

56. The memory module as recited in claim 34, further comprising thermal management structures.

57. The memory module as recited in claim 56, wherein said thermal management structures comprise heat-conductive fins in thermal contact with at least one of said plurality of memory devices.

58. The memory module as recited in claim 34, wherein said first electrical connection means and said spacer are both located on said first surface of said substrate.

59. The memory module as recited in claim 58, further comprising second electrical connection means having a predetermined height and being operatively connected to said plurality of electrical contacts forming an extension of said external memory bus, and a second spacer having a height approximately equal to said predetermined height of said second electrical connection means, said second electrical connection means and said second spacer being located on said second surface of said substrate.

60. A stackable memory subsystem comprising a plurality of stackable memory modules, each of said stackable memory modules comprising:
   a) a substrate having a first surface and a second surface and a plurality of contact pads disposed thereon, said contact pads being adapted to connect to an external memory bus;
   b) first and second electrical connection means spaced apart on each of said surfaces of said substrate and being operatively connected to said plurality of electrical contacts forming an extension of said external memory bus;
   c) a plurality of memory devices mounted on said substrate and being selectively connected to said memory bus extension; and
   d) a configuration device located on said memory module to store information thereof;
      wherein each of said stackable memory modules is positionally independent within said stackable memory subsystem.

61. The stackable memory subsystem as recited in claim 60, wherein said external memory bus comprises a characteristic impedance.

62. The stackable memory subsystem as recited in claim 60, further comprising an additional module.

63. The stackable memory subsystem as recited in claim 62, wherein said additional module is a termination module.

64. The stackable memory subsystem as recited in claim 63, wherein said termination module comprises bus termination means for operative connection to said extension of said external memory bus, said bus termination means having an impedance substantially matching said characteristic impedance.

65. The stackable memory subsystem as recited in claim 64, wherein said bus termination means comprises at least one electrical component from the group: resistors, capacitors and inductors.

66. The stackable memory subsystem as recited in claim 65, wherein said resistors comprise discrete resistors.

67. The stackable memory module as recited in claim 65, wherein said resistors comprise a resistor pack.

68. The stackable memory subsystem as recited in claim 64, wherein said bus termination means comprises a semiconductor device.

69. The stackable memory subsystem as recited in claim 62, wherein said additional module comprises a memory controller.

70. The stackable memory subsystem as recited in claim 60, wherein said memory devices comprise SDRAM devices.

71. The stackable memory subsystem as recited in claim 60, wherein said memory devices comprise DDR SDRAM devices.

72. The stackable memory subsystem as recited in claim 60, wherein said external memory bus comprises a plurality of channels.

73. The stackable memory subsystem as recited in claim 60, wherein said stackable memory modules comprise a plurality of channels.

* * * * *